United States Patent [19]

Formoy

[11] 4,001,854
[45] Jan. 4, 1977

[54] PLATE PROCESSING MACHINES
[75] Inventor: Alec James Formoy, South Ockenden, England
[73] Assignee: Vickers Limited, London, England
[22] Filed: Jan. 7, 1975
[21] Appl. No.: 539,170
[52] U.S. Cl. .................. 354/318; 118/64; 118/223; 118/206
[51] Int. Cl.[2] .............. G03D 3/08; G03D 5/00
[58] Field of Search .......... 354/317, 318, 325; 134/64 R, 64 P; 15/77, 102; 118/223, 225, 206, 236, DIG. 23, 248, 603, 64

[56] References Cited
UNITED STATES PATENTS

| | | | |
|---|---|---|---|
| 1,615,778 | 1/1927 | Walstead | 118/221 |
| 3,448,720 | 6/1969 | Graham | 118/DIG. 23 |
| 3,465,663 | 9/1969 | Calder | 118/223 X |
| 3,593,641 | 7/1971 | Adams et al. | 354/317 |
| 3,682,079 | 8/1972 | Casson, Jr. | 354/318 |
| 3,682,082 | 8/1972 | Stievenart | 354/318 |
| 3,752,054 | 8/1973 | Scanlan | 354/317 |

Primary Examiner—John P. McIntosh
Attorney, Agent, or Firm—Sandoe, Hopgood

[57] ABSTRACT

A machine for processing image-wise exposed light sensitive plates comprises processing rollers for agitating developer liquid in contact with the plate as the plate passes through the machine. The plate is urged into contact with the rollers by a plate member which is preferably adjustable and provided with recesses and preferably the developer applied to the plate is filtered developer and is applied by spraying. After developer has been removed, the plate is urged into contact with a roller, dipped in desensitizing solution, by means of, for example, a preferably adjustable second plate member. The desensitized developed plate is then dried before leaving the machine.

10 Claims, 5 Drawing Figures

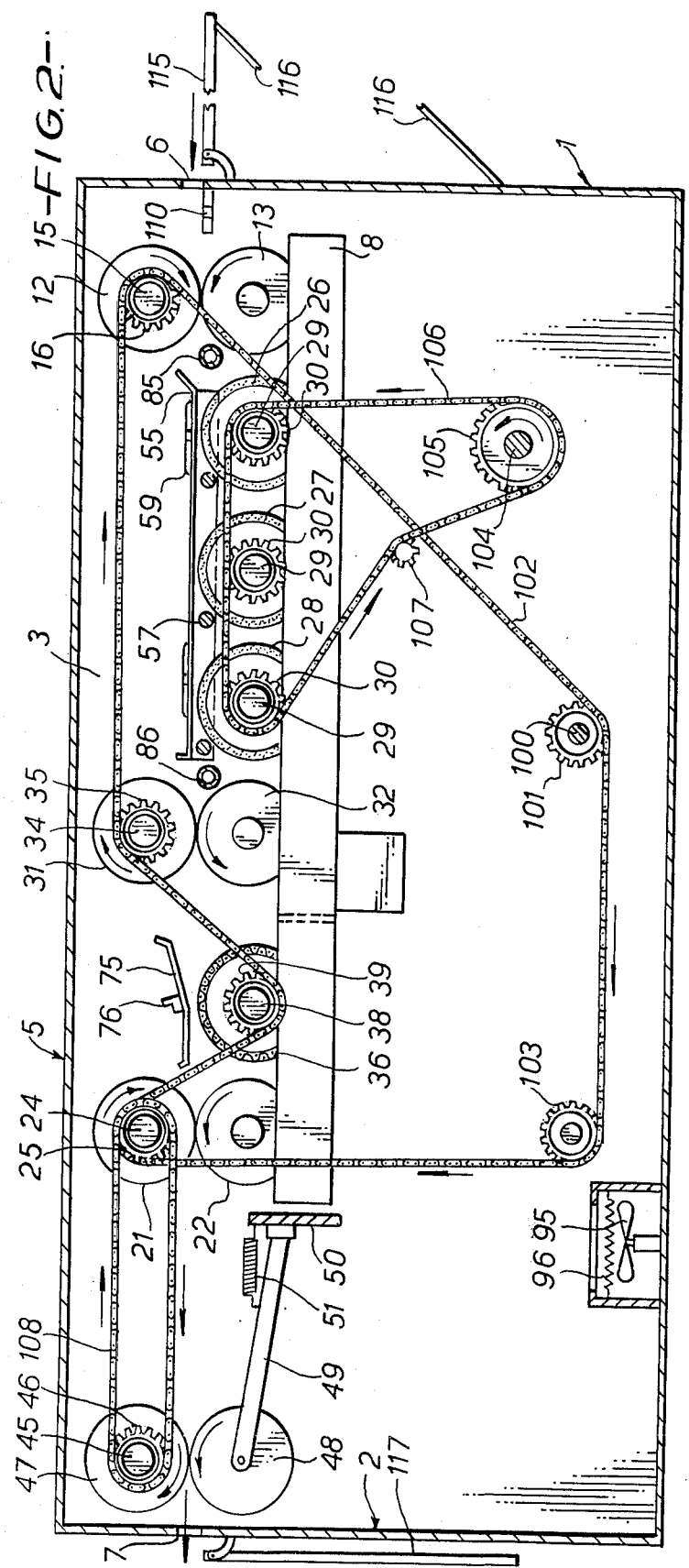

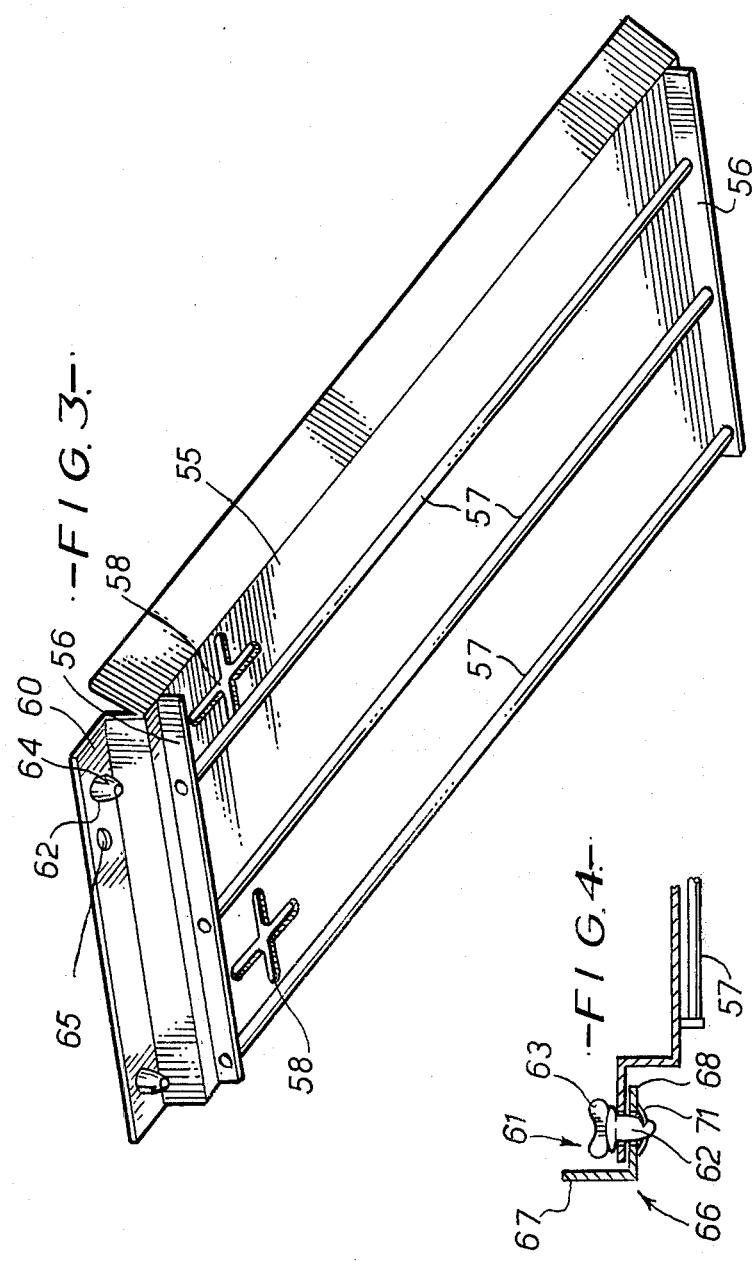

PLATE PROCESSING MACHINES

This invention relates to a machine for processing image-wise exposed light sensitive plates in lithographic printing plate production.

Plate processing machines are known wherein the plates are moved along a path through the machine whilst they are treated with a developer to remove the more soluble areas of the image-wise exposed material of the plate and with a desensitising solution.

In some conventional machines, the path of the plates through the machine is arcuate and hence a permanent set may be put into the plates during processing. This is particularly likely with relatively thick plates.

It is an object of the present invention to provide a processing machine wherein the plates move along a substantially straight path through the machine.

In some conventional machines developer is applied by means of rapidly rotating rollers which brush the plate as it passes along the path. Such rollers have a tendency to cause deformation of the trailing edge of the plate and it is known to prevent this phenomenon by changing the direction of rotation of the rollers when the trailing edge of the plate approaches the same. This leads to increased complexity and also prevents the machine from being able to process two plates simultaneously unless they are appropriately synchronised along the path.

It is an object of the present invention to provide an improved machine wherein trailing edge deformation is prevented without the foregoing disadvantages.

In the case of conventional machines where developer and desensitiser are applied by means of rollers, the plates are generally urged into contact with the rollers by being passed through nips formed between these rollers and backing rollers. Such a construction has the disadvantage that it is not readily possible to alter the pressure applied by the backing rollers to compensate for, for example, roller wear or different plate thicknesses.

It is an object of the present invention to provide a processing machine where the pressure urging the plates against the rollers applying developer or desensitiser can be readily varied.

In the production of lithographic printing plates, it is known to use light sensitive plates comprising a layer of photopolymer or other light sensitive material in combination with a pigment which is insoluble in the developer for the material. It has been found that the presence of insoluble pigment in the developer causes wear of the rollers used to apply the developer and generally renders the development less efficient.

It is an object of the present invention to overcome the disadvantages caused by the presence of pigment in the developer.

According to the present invention there is provided a machine for processing a lithographic printing plate carrying an image-wise exposed layer of light sensitive material, which machine comprises a support and, mounted on the support, a. a means for moving the plate with said layer face downwards along a path through the machine, b. a first reservoir mounted beneath the path for containing developer, c. a plurality of processing rollers rotatably mounted transversely of the path and disposed within said first reservoir, d. a means of rotating the processing rollers at a speed greater than the speed at which the plate is moved through the apparatus so that the processing rollers exert a brushing action on said layer in the same direction as that in which the plate moves along the path, e. a plate member located above and transversely of the path to urge said layer of the plate against the processing rollers so that the processing rollers apply developer from the reservoir to said layer and agitate the developer in contact with said layer to develop the same, f. a means located adjacent the path for removing developer from said layer, g. a second reservoir for containing a desensitising solution and mounted beneath the path downstream of the first reservoir, h. a desensitising roller rotatably mounted transversely of the path and disposed within said second reservoir beneath said path in brushing relationship with respect to the developed layer of the plate as the plate moves along the path, i. a means of rotating the desensitising roller, j. a means of urging the developed layer of the plate against the desensitising roller so that the desensitising roller applies desensitising solution from the second reservoir to the developed layer, and k. a means located adjacent to the path for drying the desensitised developed layer of the plate as the plate moves along the path.

In a preferred embodiment, said means for moving the plate along said path includes first, second and intermediate pairs of driven rollers rotatably mounted on the support transversely of the path, the rollers of each pair co-operating together to form a nip through which the path passes. The intermediate pair is located between the desensitising roller and the processing roller adjacent thereto, the rollers of the intermediate pair being rubber covered so that they exert a squeegee action and serve as the means of removing developer. In this embodiment it is further preferred for the first pair of transport rollers and the pair of intermediate rollers to be located in the first reservoir and for the machine to include a means downstream of said first pair to spray developer towards the nip defined by said first pair and a means upstream of said pair of intermediate rollers to spray developer towards the nip defined by said pair of intermediate rollers. Said means of spraying developer towards said nips advantageously comprise first and second tubes mounted on the support transversely of the path, the first tube being provided with a plurality of outlets directed towards the nip defined by said first pair, the second tube being provided with a plurality of outlets directed towards the nip defined by said pair of intermediate rollers, the machine further including a pump to feed developer from the first reservoir to the tubes. Preferably a filter is provided operably connected between the pump and said tubes so that filtered developer is sprayed towards said nips.

Advantageously said plate member is releasably secured to a member adjustably secured to the support so that the distance between said plate member and the processing rollers may be adjusted to vary the pressure applied by the plate member to the plate as it moves along the path. Further, the face of the plate member which abuts against the plate as it passes along the path to urge said layer against the processing rollers preferably is provided with a plurality of recessed portions, of preferably cruciform shape, which do not contact the plate.

The means of urging the developed layer of the plate against the desensitising roller advantageously comprises a second plate member mounted above and transversely of the path on a member adjustably affixed to the support so that the distance between the second plate member and the desensitising roller may be adjusted to vary the pressure applied by the second plate member to the plate as it moves along the path.

The means for moving the plate along said path preferably additionally includes a plurality of first discs mounted on, and for rotation with, a shaft rotatably mounted on the support transversely of the path and a plurality of second discs each of which is mounted independently of the others and is resiliently urged against one of the first discs, the path passing through the nips defined by the pairs of co-operating discs.

For a better understanding of the invention and to show how the same may be carried into effect reference will now be made by way of example to the accompanying drawings, in which:

FIG. 2 is a view of the other side of the machine shown in FIG. 1.

FIG. 3 is a perspective view from underneath of a part of the machine of FIGS. 1 and 2, FIG. 4 is a sectional view of a part of the machine shown in FIGS. 1 to 3.

Figure 1:
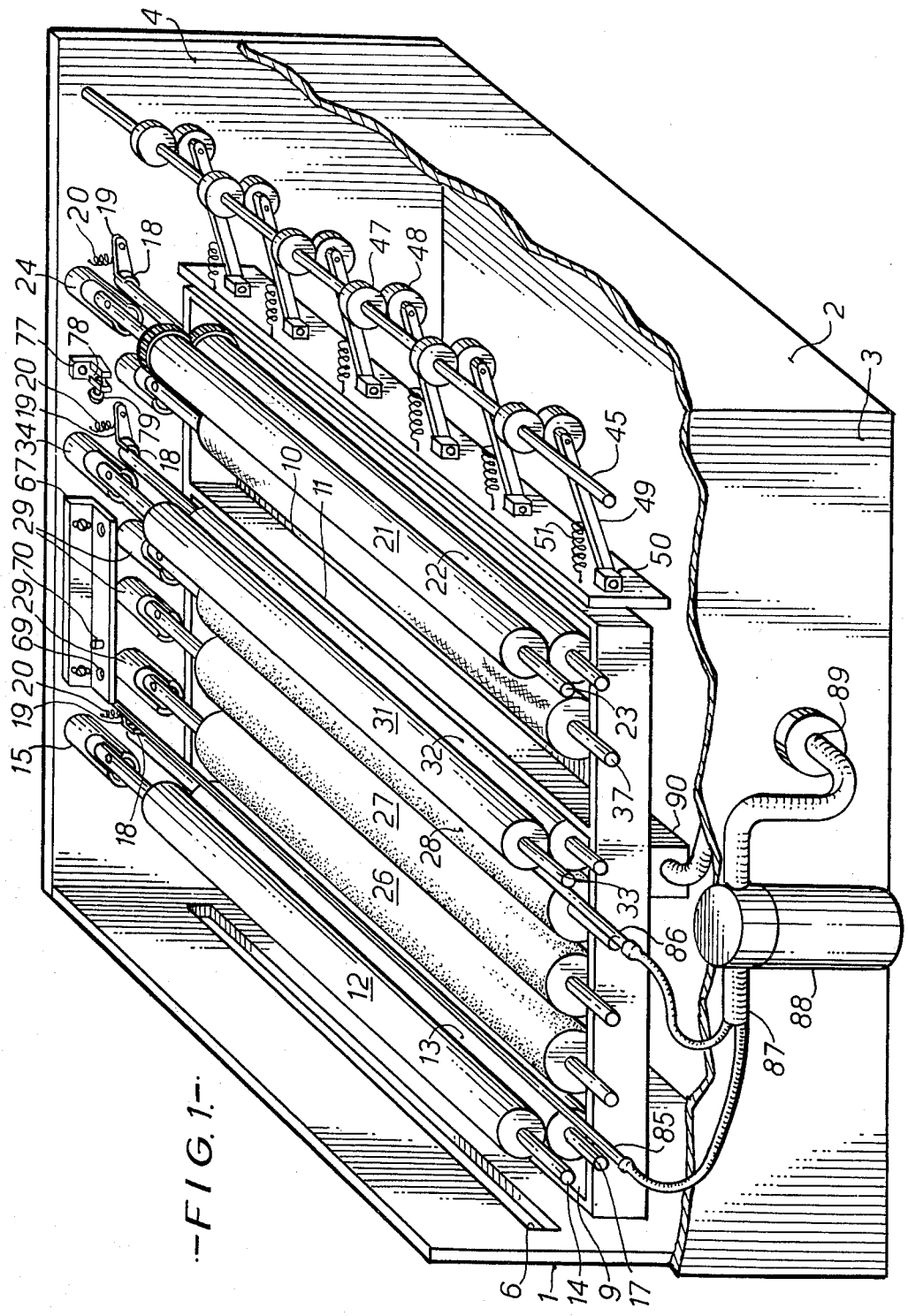
FIG. 1 is a side perspective view of a machine in accordance with the invention for processing a lithographic printing plate.

Referring to the drawings, the machine includes a support comprising a first side frame 3 and a second side frame 4 held in rigid spaced relationship by a plurality of spacer bars (not shown). Mounted on the frame are a front plate 1, a rear plate 2, and a top plate 5. The top plate 5 has been omitted from FIG. 1 in the interests of clarity. Also in the interests of clarity, the second side frame 4 has been notionally omitted from FIG. 2.

An inlet 6 for image-wise exposed plates is provided in the front plate 1 and an outlet 7 for the processed plates is provided in the rear plate 2. A straight path is provided through the machine to enable the plates to pass from the inlet 6 to the outlet 7 and located below this path is a tray 8 secured to the support and formed of polypropylene. The tray is generally rectangular in shape and is divided by a partition 11 into a first reservoir 9 for containing developer and a second reservoir 10 for containing desensitising solution. The second reservoir is downstream of the first reservoir.

Located at the front portion of the first reservoir 9 is a first pair of butyl rubber covered rollers. These consist of an upper roller 12 and a lower roller 13 arranged to co-operate together to form a nip and mounted for rotation on the support. The rollers are mounted transversely of the path of the plates through the machine so that the path passes through the nip. The upper roller 12 is carried on a rotatable shaft 14 having one end supported in a self-aligning bearing (not shown) in first side frame 3 and its other end coaxially secured to a short shaft 15 extending through the second side frame 4 and mounted in a flange mounted ball bearing housed in the second side frame 4. One end of the shaft 15 is provided with a bore to receive the end of the shaft 14. The bore is partially cut away so as to enable the end of the shaft 14 to be presented to or displaced from the shaft 15 in a radial direction. In this way, the shaft 14 and the roller 12 can readily be removed from the machine when it is desired to service the machine. Ordinarily, the end of the shaft 14 is secured into the bore of the shaft 15 by a threaded screw passing through the end of the shaft 14 and into the bore-defining portion of the shaft 15. A sprocket 16 is carried on that end of the shaft 15 which protrudes beyond the side frame 4.

The lower roller 13 is carried on a shaft 17 which is journalled at each end in a needle bearing mounted in a cup 18 carried by a member 19 pivotally secured to the side frame 3 or 4 as the case may be and urged by means of a spring 20 anchored to the side frame towards the upper roller 12. In this way, the lower roller 13 is resiliently urged towards the upper roller 12.

A second pair of butyl rubber covered rollers is located at the rear portion of the second reservoir 10. This second pair of rollers comprises an upper roller 21 and a lower roller 22 geared together at one end. These rollers are mounted in the machine in a manner analogous to rollers 12 and 13. Thus the upper roller 21 is carried on a shaft 23 which has one end coaxially secured into a bore of a short shaft 24 mounted in bearings in the second side frame 4 and its other end mounted in self-aligning bearings in the first side frame 3 and the lower roller 22 is mounted in cups 18 carried by members 19 and is urged by springs 20 against the upper roller 21 to form a nip through which the path passes and extending transversely of the path. That end of the short shaft 24 which protrudes beyond the second side frame carries a double sprocket 25.

Three processing rollers 26, 27 and 28 covered in long pile plush are mounted for rotation in self-aligning bearings and in short axles 29 in a manner analogous to rollers 12 and 21. On that part of each axle 29 which passes through the second side frame 4 there is mounted a sprocket 30. The processing rollers 26, 27 and 28 are located within the first reservoir 9 and extend transversely of the path of the plates through the machine so that they are in brushing relationship with the lower face of each plate passing along the path.

Located between the first pair of rollers 12 and 13 and the second pair of rollers 21 and 22 is an intermediate pair of butyl rubber covered rollers comprising an upper roller 31 and a lower roller 32 mounted to co-operate together to form a nip through which the path passes. The rollers 31 and 32 are positioned towards the rear of the first reservoir 9 and are mounted transversely of the path in an analogous manner to the first and second pairs of rollers. Thus the upper roller 31 is mounted on a shaft 33 journalled at one end in a self-aligning bearing housed in the side frame 3, and at its other end, is coaxially secured in a releasable manner in the bore of a short shaft 34, the shaft 34 is journalled in the side frame 4, that part of the shaft 34 extending beyond the side frame 4 has a sprocket 35 affixed thereto, and the lower roller 32 is carried on a shaft rotatably mounted in cups 18 carried by members 19 pivotally secured to the side frames and is urged against the upper roller 31 by springs 20.

Located towards the front of the second reservoir 10 is a cloth covered desensitising roller 36. This is mounted so that it extends transversely of, and below, the path of the plates through the apparatus in brushing relationship with the plates. The roller 36 is mounted for rotation on a shaft 37 in a manner analogous to rollers 12, 21, 26, 27, 28 and 31. Thus one end of the shaft 37 is located in a self-aligning bearing in side frame 3 and the other end of the shaft is coaxially secured, in a releasable manner, in a bore in a short shaft 38 journalled in side frame 4 and that end of shaft 38 which extends beyond side frame 4 is provided with a sprocket 39.

Mounted downstream of the tray 8, between the second reservoir 10 and the outlet 7, there is provided a final delivery system for the plates. This comprises a shaft 45 mounted transversely of the shaft in bearings in the side frames 3 and 4 and carrying a sprocket 46. Mounted on the shaft at spaced intervals and rotatable therewith is a plurality of first discs 47. Each disc 47 is arranged so that it is located just above the path of the plates through the machine. Located beneath the first discs is a plurality of independently mounted second discs 48. Each second disc is carried on an arm 49 pivotally secured to a member 50 forming a part of the support of the machine and a spring 51 is connected between the arm 49 and the member 50 so as to resiliently urge each second disc 48 into contact with its associated first disc 47. The path of the plates through the machine passes through the nips defined by each pair of co-operating discs 47 and 48.

Located above the processing rollers 26, 27 and 28 there is mounted a stainless steel plate member 55 extending transversely across the path of the plates through the machine. The plate member 55 is shown in more detail in FIG. 3. The plate member 55 is provided with a pair of depending flanges 56 at each of its ends and three rods 57 have their ends located in these flanges and are arranged so that they are spaced from the under face of the plate member 55. The under face of the plate member 55 is provided with a plurality of cruciform recesses distributed uniformly over the whole of its surface. Two only of the recesses are shown and are denoted by reference numeral 58. The recesses are produced by stamping and form corresponding protuberances 59 on the upper face of the plate member. Provided at each end of the plate member 55 is an angled portion including an abutment 60. Located in each abutment are two connecting elements 61 each comprising a barrel portion 62 and a portion 63 shaped to facilitate manual rotation of the connecting element. A recess 64 is provided in the barrel portion 62. An aperture 65 is provided in the abutment 60 and is positioned nearer to one of the connecting elements 61 than to the other. The connecting elements are shown more clearly in FIG. 4.

Mounted on each of the side frames 3 and 4 and above the processing rollers 26, 27 and 28 is a support means for the plate member 55. Each support means is in the form of an angle member 66 including a vertically extending portion 67 and a seating portion 68 (see FIG. 4). The portion 67 of each angle member 66 is provided with a pair of slots through which a screw extends to secure the angle member 66 to the side frame. The slots enable the angle member 66 to be adjusted vertically further away from or closer to the processing rollers as desired. The seating portion 68 of each angle member 66 is provided with a pair of apertures 69 and a pin 70. The apertures 69 and pin 70 are registerable with the connecting elements 61 and the aperture 65 respectively. The apertures 69 and pin 70 are arranged to co-operate with the connecting elements 61 and aperture 65 of the plate member 55 when the abutment surfaces 60 of the plate member 55 are supported on the seating portions 68 of the angle members 66. Disposed below the apertures 69 in the seating portions 68 are spring clips 71 (see FIG. 4) arranged to co-operate with the recess 64 in the barrel portion 62 of each connecting element 61 to anchor the plate member 55 onto the seating portions 68 of the angle members 65. When it is desired to remove the plate member 55, the connecting elements 61 are rotated by means of the portion 63 so that the spring clips 71 ride out of the recesses 64 and no longer retain the connecting elements 61 in the aperture 69. Thus, the plate member 55 can be readily released and removed from the machine, and, moreover, may be replaced in due course in exactly the same position. More particularly, the spacing between the plate member 55 and the processing rollers 26, 27 and 28 will not be altered since this depends upon the vertical disposition of the angle members 66. When the plate member 55 is in position on the seating portions 68, each of the rods 57 of the plate member 55 should be located just downstream of its associated roller 26, 27 or 28 and be about 1/16 inch away from the plush of the roller. This can only be achieved when the plate member 55 is in a particular orientation, and the non-symmetrical disposition of the co-operating pin 70 and aperture 65 ensures that the plate member 55 has this orientation when mounted on the angle members 66. The path of the plates through the machine passes between the rods 57 and the recessed under face of the plate member 55.

Located above the cloth covered roller 36 is a second plate member 75 extending transversely across and just above the path of plates through the machine. The plate member 75 is coated with nylon and is carried on a bar 76 held at its ends in connecting members 77 secured to the first and second side frames 3 and 4. Each of these connecting members 77 is bolted to its associated side frame and has a U-shaped recess 78 adapted to recieve the end of the bar 76, a screw 79 being provided to secure the bar in the recess. By slackening off the bolts securing the members 77 to the side frame, pivoting the members 77, and re-tightening the bolts, it is possible to vary the distance between the plate member 75 and the cloth covered roller 36.

A tube 85 is mounted transversely of, and just below, the path through the machine and is secured at its ends to the side frames 3 and 4 so that it is just downstream of the first pair of rollers 12 and 13. The tube 85 is provided with a plurality of apertures generally directed towards the nip between the rollers 12 and 13. A similar tube 86 is similarly mounted just upstream of the intermediate rollers 31 and 32 and includes a plurality of apertures generally directed towards the nip between rollers 31 and 32. Each of the tubes 85 and 86 is connected by tubing 87 to a filter 88 mounted on the side frame 3. Further tubing 89 connects the filter to the base of the first reservoir 9 via the intermediary of a pump 90.

A fan 95 is provided in the machine to blow air over an electrically heated element 96 and thence across the plate path between the rollers 21 and 22 and the final delivery system constituted by discs 47 and 48.

Figure 5:
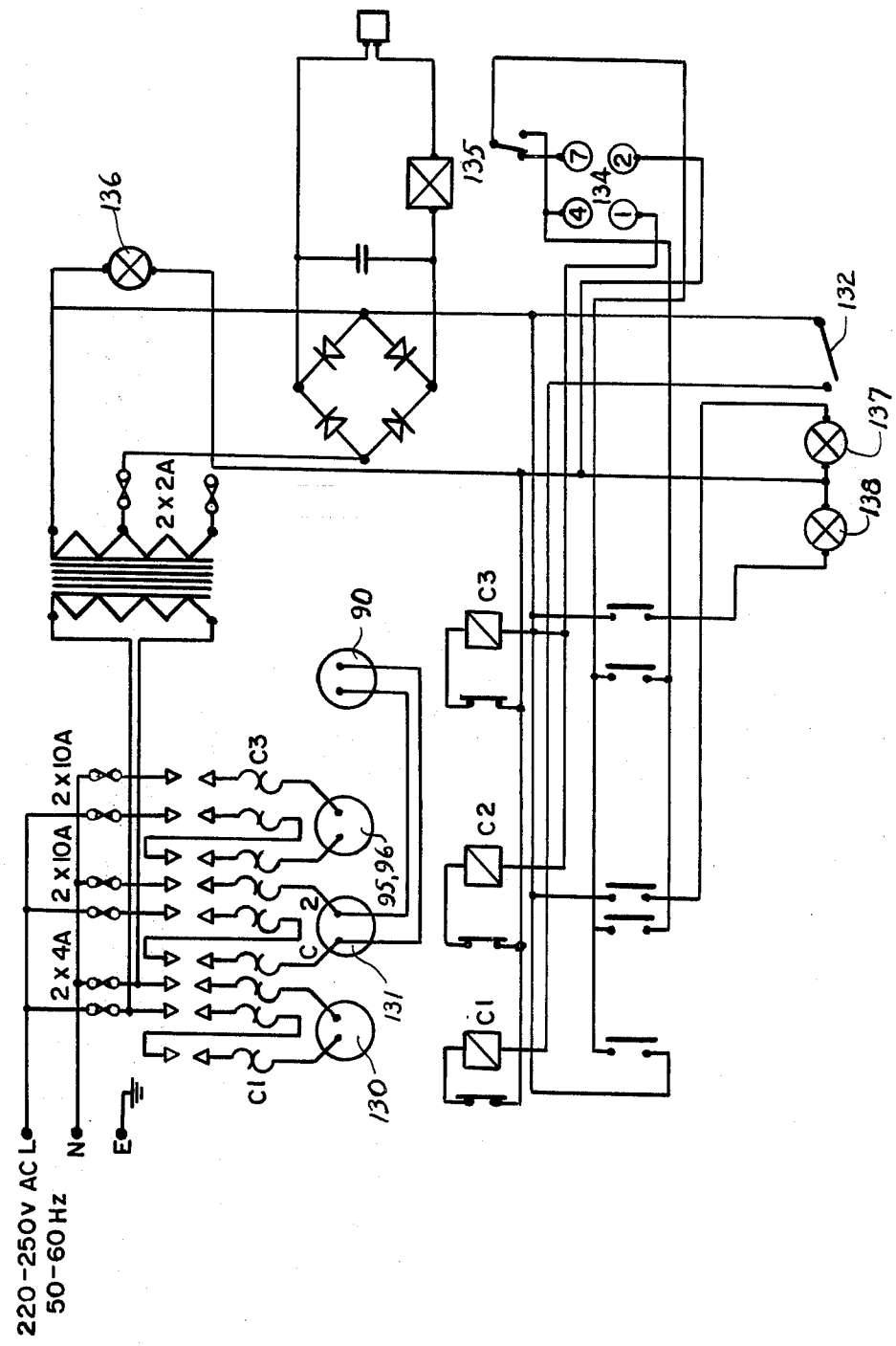
FIG. 5 is an electrical circuit diagram of the machine of FIGS. 1 to 4.

The machine includes a first electric motor 130 (see FIG. 5) having a main drive shaft 100 carrying a sprocket 101. A main drive chain 102 is trained around the sprocket 101 and the sprockets 16, 35, and 39, one of the sprockets 25, and sprocket 103. The machine also includes a second electric motor 131 (see FIG. 5) having a drive shaft 104 which carries a sprocket 105. A secondary chain 106 is trained around this sprocket and around sprockets 29 of the processing rollers 26, 27 and 28 and over a tensioning sprocket 107. A further chain 108 is trained around the other of the sprockets 25 and the sprocket 46 to drive the final delivery system. The gearing is such that shaft 104 rotates at a speed much greater than shaft 100. Hence the processing rollers 26, 27 and 28 rotate much faster than the other rollers. There is no provision for changing the direction of rotation of any of the rollers. The pump 90 and the fan 95 each have their own separate drive motors.

The first electric motor 130 is controlled by a master ON/OFF switch 132 (see FIG. 5) which also energises a proximity switch 133 (see FIG. 5) located at position 110 adjacent the path of the plates through the machine just downstream of the inlet 6. The proximity switch 133 is operably connected to the second electric motor 131 so that when it is actuated to the ON position the drive shaft 104 starts to rotate provided, of course, that the master switch 132 is in the ON position. The heating element 96, the motor for the pump 90 and the motor for the fan 95 is also controlled by the proximity switch 133. A timer 134 (see FIG. 5) is operably connected with the proximity switch 133 via relay 135 (see FIG. 5) so that when the proximity switch 133 returns to the OFF position the timer 134 is actuated and, after a predetermined interval of time, stops the second motor 131 and switches off the heating element 96, the pump 90 and the fan 95. The machine includes indicator lights 136, 137 and 138 (see FIG. 5) which become illuminated when the main motor 130, the second motor 131 and pump 90, and the fan 95 and heater 96, respectively are in operation.

The machine includes a receiving table 115 located adjacent the inlet 6 and connected to the front plate 1 and supported by a stay 116. A delivery table 117 is provided on the rear plate 2 to collect processed plates leaving the outlet 7. The table 117 can be collapsed so that in a rest position the table lies adjacent to the rear face 2. The table 115 and the path of the plates from the inlet 6 to the outlet 7 lie substantially along a straight line.

The machine of the present invention is particularly useful for processing image-wise exposed light sensitive plates wherein the light sensitive layer of the plate is a pigmented photopolymer.

In use, the first reservoir 9 is filled with a developer e.g. an organic liquid which is a solvent for non-light-struck photopolymer but which will not dissolve light-struck photopolymer and the second reservoir 10 is filled with a desensitising solution e.g. aqueous gum arabic. The master ON-OFF switch 132 is then actuated so that the indicator light 136 illuminates and the first motor 130 commences and starts to drive the rollers 12 and 13, 31 and 32, 21 and 22, shaft 45 and the cloth covered roller 36. These rollers serve inter alia as transport rollers to move the plates along the path through the machine.

The plate to be processed is placed with its image-wise exposed layer downwards on the receiving table 115 and is manually introduced through the inlet 6 and into the nip between the rollers 12 and 13. As the leading edge of the plate passes the proximity switch 133, it trips the switch which then actuates the second motor 131 to operate the drive shaft 104. Thus, the processing rollers 26, 27 and 28 are caused to rotate rapidly in such a way that they will exert a brushing action on the plate in the direction of movement of the plate. Also, the motor for the fan 95, the heating element 96 and the motor for the pump 90 are caused to operate. The associated indicator lights 137 and 138 are also illuminated. When the trailing edge of the plate passes the proximity switch 133 and timer 134 is actuated which, after a predetermined interval, stops the second motor 131 (and hence drive shaft 104 and the developer rollers 26, 27 and 28), the motor for the fan 95 and the motor for the pump 90 and also de-actuates the heating element 96, and extinguishes the indicator lights 137 and 138. As the plate is pulled through the nip between the rollers 12 and 13, it receives some developer from the rollers since roller 13 is supplied with a liberal quantity of developer by the spray tube 85. As soon as the plate protrudes beyond the nip, the image-wise exposed layer is sprayed with developer from the first tube 85. The plate then passes between the under face of the plate member 55 and the rods 57 of the plate member 55 during which time the processing rollers 26, 27 and 28, which are rapidly rotating in the developer, apply further developer to the layer and also agitate the developer in contact with the layer. The under face of the plate member 55 abuts against the plate and urges the layer of the plate against the processing rollers and the pressure applied by the plate member 55 can be adjusted in dependence for example on any wear of the processing rollers or variation in plate thickness by altering the vertical disposition of the angle members 66 with respect to the side frames. As the trailing edge of the plate passes each processing roller, the rod 57 associated therewith serves to support the trailing edge of the plate, so as to prevent deformation of the trailing edge of the plate as it passes the processing rollers. The recessed portions 58 in the under face of the plate member 55 do not contact the plate and assist in allowing the plate to slide past the under face of the plate member 55 since they provide a cushion of air which prevents the plate and the plate member adhering together. After the plate has passed the processing rollers, its under face is sprayed with developer from tube 86. The action of the developer is to remove the photopolymer and pigment from the non-light-struck areas of the layer and most of the developer is removed from the plate as it passes through the nip of the rollers 31 and 32 which exert a squeegeeing action on the plate. The developer emanating from the tubes 85 and 86 is filtered developer and hence is free of pigment. This assists in preventing pigment build-up on the rollers and also aids development. In the event that the processing rollers should become worn, the setting of the plate member 55 can be adjusted by means of the slots in the vertically extending portions 67 of the angle members 55. If it should be necessary to replace the processing rollers (or indeed any of the rollers) this can be readily effected, on removal of the plate member 55, because of the way in which the shafts of the rollers are mounted in the side frames. Moreover, the plate member 55 can be removed from the machine without disturbing its setting merely by turning the connecting elements 61 holding the same to the seating portions 68 of the angle members 66.

After the plate has passed through the nip of the rollers 31 and 32 and the majority of the developer has been removed, the plate then passes between the cloth covered roller 36 and the second plate member 75. The plate member 75 is so arranged that it urges the plate into contact with the cloth covered roller 36. This roller 36 is rotating in the gumming solution and applies a layer of gumming solution to the developed layer on the plate. The pressure exerted by the plate member 75 on the plates can be varied merely by slackening the bolts holding the members 77 to the side frames and suitably pivoting the members 77 about the bolts before re-tightening.

The plate member 75 directs the gummed developed plate through the nip between rollers 21 and 22 which exert a squeegee action on the plate to remove surplus gum. The plate is then subjected to a stream of hot air from the fan 95 which dries the plate before it passes to the final delivery system consisting of the discs 47 and the independently sprung co-acting discs 48 which feed the plate out onto the delivery table 117. The independently sprung final delivery system prevents the plate from skewing as it leaves the machine.

After the plate has left the machine, and the predetermined length of time has elapsed, the timer 134 stops the second motor 131 and hence the drive shaft 104, the processing rollers 26, 27 and 28, the pump 90, and the fan 95 cease functioning and the heating element 96 is switched off and the indicator lights 137 and 138 are extinguished. The transport rollers, the gumming roller and the final delivery system continue to rotate however until such time as the master switch 132 is turned to the OFF position.

I claim:
1. A machine for processing a lithographic printing plate carrying an image-wise exposed layer of light sensitive material, which machine comprises a support and, mounted on the support,
    a. means for moving the plate with said layer face downwards along a straight path through the machine,
    b. a first reservoir mounted beneath the path for containing developer,
    c. a plurality of rotatably mounted processing rollers extending transversely of the path in brushing relationship with said layer and disposed within said first reservoir,
    d. means for rotating all of the processing rollers in the same direction as that in which the plate moves and at a speed greater than the speed at which the plate is moved through the apparatus so that all of the processing rollers exert a brushing action on said layer in the same direction as that in which the plate moves along the straight path,
    e. a flat plate member located above and extending transversely of the path to urge said layer of the plate against the processing rollers so that the processing rollers apply developer from the reservoir to said layer and agitate the developer in contact with said layer to develop the same, means for adjusting said plate member with respect to the support so that the distance between said plate member and the processing rollers may be adjusted to vary the pressure applied by the plate member to the plate as it moves along the path,
    f. means located adjacent the path for removing developer from said layer,
    g. a second reservoir for containing a desensitizing solution and mounted beneath the path downstream of the first reservoir,
    h. a rotatably mounted desensitizing roller extending transversely of the path and disposed within said second reservoir beneath said path in brushing relationship with respect to the developed layer of the plate as the plate moves along the path,
    i. means for rotating the desensitizing roller,
    j. means for urging the developed layer of the plate against the desensitizing roller so that the desensitizing roller applies desensitizing solution from the second reservoir to the developed layer, and
    k. means located adjacent to the path for drying the desensitized developed layer of the plate as the plate moves along the path.

2. A machine as claimed in claim 1, wherein said means for moving the plate along said straight path includes first and second pairs of transport rollers rotatably mounted on the support and extending transversely of the path, the rollers of each pair co-operating together to form a nip through which the path passes.

3. A machine as claimed in claim 2, wherein the means of removing developer comprises a pair of driven intermediate rubber covered rollers rotatably mounted on the support and extending transversely of the path, which intermediate rollers co-operate together to form a nip through which the straight path passes and are located between the desensitising roller and the processing roller adjacent thereto.

4. A machine as claimed in claim 3, wherein the first pair of transport rollers and the pair of intermediate rollers are located in the first reservoir, the machine further including a means downstream of said first pair to spray developer towards the nip defined by said first pair and a means upstream of said pair of intermediate rollers to spray developer towards the nip defined by said pair of intermediate rollers.

5. A machine as claimed in claim 4, wherein said means of spraying developer towards said nips comprise first and second tubes mounted on the support transversely of the path, the first tube being provided with a plurality of outlets directed towards the nip defined by said first pair, the second tube being provided with a plurality of outlets directed towards the nip defined by said pair of intermediate rollers, the machine further including a pump to feed developer from the first reservoir to the tubes.

6. A machine as claimed in claim 5, wherein the machine additionally includes a filter operably connected between the pump and said tubes so that filtered developer is sprayed towards said nips.

7. A machine as claimed in claim 1, wherein said plate member is releasably secured to a member adjustably secured to the support.

8. A machine as claimed in claim 1, wherein said flat plate member flat face which abuts against the plate as it passes along the straight path to urge said layer against the processing rollers and wherein said face is provided with a plurality of recessed portions which do not contact the plate.

9. A machine as claimed in claim 1, wherein the means of urging the developed layer of the plate against the desensitising roller comprises a second plate member mounted above and extending transversely of the path on a member adjustably affixed to the support so that the distance between the second plate member and the desensitising roller may be adjusted to vary the pressure applied to the second plate member to the plate as it moves along the path.

10. A machine as claimed in claim 1, wherein the means for moving the plate along said straight path includes a plurality of first discs mounted on and for rotation with a shaft rotatably mounted on the support transversely of the path and a plurality of second discs each of which is mounted independently of the others and is resiliently urged against one of the first discs.

* * * * *